United States Patent [19]

Chan

[11] Patent Number: 5,055,894

[45] Date of Patent: Oct. 8, 1991

[54] MONOLITHIC INTERLEAVED LED/PIN PHOTODETECTOR ARRAY

[75] Inventor: Eric Y. Chan, Mercer Island, Wash.

[73] Assignee: The Boeing Company, Seattle, Wash.

[21] Appl. No.: 537,004

[22] Filed: Jun. 12, 1990

Related U.S. Application Data

[60] Continuation of Ser. No. 380,152, Jul. 14, 1989, abandoned, which is a division of Ser. No. 251,134, Sep. 29, 1988, Pat. No. 4,879,250.

[51] Int. Cl.$^5$ .................. H01L 31/12; H01L 31/16; H01L 27/14; H01L 31/00
[52] U.S. Cl. .................................. 357/19; 357/30; 357/17; 372/44; 372/45; 372/50
[58] Field of Search .............. 357/30 B, 30 L, 17, 357/19; 372/45, 44, 50

[56] References Cited

U.S. PATENT DOCUMENTS

| 3,979,587 | 9/1976 | de Cremoux | 357/19 |
|---|---|---|---|
| 4,068,252 | 1/1978 | Lebailly | 357/19 |
| 4,115,150 | 9/1978 | Dyment | 357/17 |
| 4,152,044 | 5/1979 | Liu | 350/96.12 |
| 4,152,713 | 5/1979 | Copeland | 357/19 |
| 4,275,404 | 6/1981 | Cassiday et al. | 357/19 |
| 4,359,775 | 11/1982 | Marschall et al. | 372/45 |
| 4,374,390 | 2/1983 | Lee | 357/17 |
| 4,461,007 | 6/1984 | Burnham et al. | 357/17 |
| 4,477,721 | 10/1984 | Chappell et al. | 357/19 |
| 4,614,958 | 9/1986 | Mikami et al. | 357/17 |
| 4,692,207 | 9/1987 | Bouadma et al. | 372/50 |
| 4,720,468 | 1/1988 | Meniguax et al. | 357/19 |
| 4,788,688 | 11/1988 | Hasenberg et al. | 357/17 |

FOREIGN PATENT DOCUMENTS

| 0070234 | 7/1982 | European Pat. Off. | 357/19 |
|---|---|---|---|
| 52-049786 | 4/1977 | Japan | 357/19 |
| 53-116792 | 12/1978 | Japan | 357/19 |
| 57-190373 | 11/1982 | Japan | 357/19 |
| 60-85579 | 5/1985 | Japan | 357/19 |
| 61-229359 | 10/1986 | Japan | 357/19 |
| 0037979 | 2/1987 | Japan | 357/19 |
| 0119981 | 6/1987 | Japan | 357/19 |
| 0065682 | 3/1988 | Japan | 357/19 |

OTHER PUBLICATIONS

Lee et al., "Dual Wavelength Surface Emitting In-GaAsP LEDS", Elec. Lett., Oct. 23, 1980, vol. 16, No. 22, pp. 845-846.

Stephen Forrest, "Optical Detectors: Three Contenders," *IEEE Spectrum*, pp. 76-84 (May 1986).

Note, "Twelve-Channel Individually Addressable In-GaAs/InP p-i-n Photodiode and InGaAsP/InP LED Arrays in a Compact Package," *Journal of Lightwave Technology*, vol. LT-5, No. 8, pp. 1118-1122 (Aug. 1987).

*Primary Examiner*—Andrew J. James
*Assistant Examiner*—Daniel Kim
*Attorney, Agent, or Firm*—Christensen, O'Connor, Johnson & Kindness

[57] ABSTRACT

Interleaved arrays of photoelectronic devices are fabricated utilizing one-step epitaxial growth of all active layers and simple planar processing. Exemplary arrays include interleaved LED transmitters and PIN photodiode receivers that operate at the same wavelength on light that enters the PINs and exits the LEDs along opposite but parallel paths and interleaved arrays of LED transmitters that emit light at two different wavelengths.

16 Claims, 5 Drawing Sheets

Fig. 1. EPITAXIALLY GROW InGaAs DETECTOR LAYER AND FOUR LED LAYERS

Fig. 2. DEPOSIT $Si_3N_4$, OPEN HOLES AND DIFFUSE Zn IN P-REGION OF P-I-N PHOTODIODE

Fig. 3. OPEN HOLES FOR LED CONTACTS

Fig. 4. DEPOSIT FRONT AND BACK METALIZATION

Fig. 5. PERFORM ISOLATION ETCH AND ETCH LED WINDOWS

Fig. 6. EPITAXIALLY GROW GaAs "STOP ETCH" WINDOW LAYER, GaAs DETECTOR LAYER AND FOUR LED LAYERS

Fig. 7. DEPOSIT $Si_3N_4$, OPEN HOLES, DIFFUSE Zn P-REGION OF P-I-N PHOTODIODE

Fig. 8. OPEN HOLES FOR LED CONTACTS

Fig. 9. DEPOSIT FRONT AND BACK METALIZATION

Fig. 10. PERFORM ISOLATION ETCH AND ETCH LED AND P-I-N WINDOWS

Fig. 11. SELECTIVELY ETCH TO COMPLETE LED WINDOWS

FIG. 15. DEPOSIT METALIZATION FOR P-CONTACTS

FIG. 16. PERFORM ISOLATION ETCH BETWEEN DEVICES

FIG. 17. DEPOSIT BACK OHMIC CONTACTS FOR LED ARRAY AND DEPOSIT $S_3N_4$ ANTI-REFLECTIVE

MONOLITHIC INTERLEAVED LED/PIN PHOTODETECTOR ARRAY

This application is a continuation of prior copending application Ser. No. 07/380,152, filed July 14, 1989, the benefit of the filing date of which is hereby claimed under 35 U.S.C. §120, which was abandoned and which was also a divisional of Ser. No. 251,134, now U.S. Pat. No. 4,879,250, filed Sept. 29, 1988.

BACKGROUND OF THE INVENTION

The present invention broadly relates to integrated optoelectronic photodetector circuits and to fabrication techniques therefor. More particularly, the invention concerns methods for fabricating arrays of photonic devices consisting of alternating light-emitting diodes (LEDs) and PIN photodetectors operable at the same wavelength or alternating LEDs that are operable at two different wavelengths. One-step epitaxial growth of all layers for the active devices and simple planar processing assure high-level, reproducible fabrication of devices having uniform characteristics.

The development of integrated optical circuits has become the subject of increased interest, especially in the area of fiber optic communications. A number of difficulties have been encountered in these efforts to fabricate different types of active devices next to each other on the same wafer.

Previously employed techniques have utilized selective epitaxial growth and multiple growth runs to integrate LED and PIN structure having different layers of III-V compound materials. Selective epitaxy on the same substrate is very difficult when the LED and PIN spacing in the arrangements is very small. Because of this, an alternative approach has been to fabricate III-V LED layers on a silicon substrate and thereafter use the silicon substrate to form the photodetectors. The problem with this approach is that the large lattice mismatch between the III-V epitaxial layers and the silicon substrate will degrade the LED quality and limit the detector's response to 0.8 micrometers ($\mu$m) wavelength.

A further problem has been the difficulty of optimizing each of the separate components on the wafer. As a result, it has been heretofore necessary to compromise the performance of one or more of the components. Where the circuits include PINs, it is usually these components that are compromised.

Nonoptimized PINs may be acceptable for monitoring applications or for use in generating electrical signals for switching, clocking or triggering. However, in a fiber optic communication system the speed and sensitivity of the detector are far more crucial than in these application. The requirements are especially stringent for integrated emitter/detector systems which operate at 1.3 $\mu$m wavelengths. For these applications, the detector must have low noise so that the system can be operated at a low bit error rate (BER), e.g., $BER = 10^{-9}$. The detector must also have a high sensitivity so that it can detect signals having powers less than a microwatt. As well, the detectors must have this sensitivity over a high bandwidth so that they can operate at data rates greater than 200 Mbits per second. To satisfy all of these requirements, the detector must have a dark current $(I_d) < 10$ nA (at 31 10 volts), quantum efficiency $(QE) > 75\%$ and a capacitance $< 1$pF (at 31 10 volts).

SUMMARY OF THE INVENTION

In accordance with the invention there are provided methods for fabricating interleaved arrays of photoelectronic devices in a single growth run and without the use of selective epitaxy. The invention makes possible the fabrication of LED/PIN arrays in which the interleaved transmitters and receivers operate at the same wavelength on light which enters the PINs and exits the LEDs along opposite but parallel paths. The invention further makes possible the fabrication of LED arrays having transmitters that emit light at different wavelengths interleaved in an alternating fashion with one another. By growing all of the epitaxial layers in a single run on a semiconductor substrate which has good lattice match to the epitaxial layers, the final integrated LED and PIN structures retain all of the good characteristics of these devices in their discrete form. These retained characteristics include low dark current, low capacitance, high LED radiance, low LED forward voltage and the like. To further enhance the performance of the arrays, the invention includes techniques for isolating the active devices so that electrical and optical crosstalk are minimized.

In accordance with one embodiment, an interleaved array of LED and PIN devices operating at a 1.3 $\mu$m wavelength are fabricated on an InP substrate using InGaAs as the active detector layer and InGaAsP as the active light-emitting layer. The initial step in this sequence is the growth of the InGaAs detector layer on the InP substrate. Thereafter, in the same growth run, the four layers for the LED structures are grown. These layers are, in sequence, an InP confining layer, the InGaAsP active emitter layer, another InP confining layer and an InGaAsP cap layer. Planar processing is then begun by depositing a layer of silicon nitride. Appropriately sized and spaced holes are then formed through the nitride layer, followed by zinc diffusion to form the p-region for the PIN structures. After the zinc diffusion, additional holes for the LED contacts are opened through the nitride layer. After these holes have been opened, metallization is deposited on the "front" (silicon nitride side) and "back" (InP substrate side) of the wafer. The front metallization is appropriately patterned to form the p-contacts for each of the LED and PIN devices, while the back metallization is patterned to form the n-contacts for the devices and to leave an opening for each device in the array.

Two steps remain for completion of the LED/PIN photodetector array: performing an isolation etch for each device on the array and etching a window for each LED in the array. The isolation etch is performed from the front of the wafer and removes part of the epitaxial layers between devices so that each device in the array is electrically as well as optically isolated. The windows for the LEDs are formed on the back of the wafer by etching a hole through the InP substrate and InGaAs "i" layer up to the first LED layer. In this final process step, a selective etchant is used to remove the InGaAs epitaxial layer.

According to an alternate embodiment of the invention, similar techniques are applied to a GaAs-based system for form interleaved LED/PIN arrays operating at a 0.8 $\mu$m wavelength. In this embodiment GaAs is used for both the substrate and the active detector layer. The LEDs are formed using three GaAlAs layers having differing amounts of aluminum for the active emitter layer and two confining layers together with a GaAlAs cap layer. The steps of forming the p-regions for the PIN diodes with zinc diffusion, application and patterning of the front and back metallization, and isolation etching are similar to the steps used in the first embodiment. The window-etching step is conceptually similar to that of the first embodiment, having as its purpose the opening of windows to each of the PIN and LED devices in the array. However, this second embodiment requires the use of an additional GaAlAs "stop etch" window layer. This layer is epitaxially grown on the GaAs substrate prior to the growth of the GaAs detector layer and four LED layers. In the window-forming step a selective etchant is used so that the etching stops at the GaAlAs "stop etch" window layer over each of the devices in the array. The portions of this layer underlying the PIN detectors are not further etched so that these portions of this layer serve as windows to these devices. The remaining exposed portions of the "stop etch" window layer and the overlying GaAs "i" layer are, however, further etched deep into the first GaAlAs LED layer to form the windows for the LEDs in the array.

According to yet a further embodiment of the invention, an interleaved array of LEDs operating at two different wavelengths is fabricated on an InP substrate. As with the first two embodiments, all of the layers for the active devices are formed in a single epitaxial growth run. The important requirement for this device is to have two active layers incorporated in the epitaxial growth process. The first active layer is a quarternary layer with composition $in_xGa_{1-x}As_yP_{1-y}$ while the second active layer is another quarternary layer with composition $In_aGa_{1-a}As_bP_{1-b}$. By adjusting the composition of these layers (varying x and y in the first active layer and a and b in the second active layer), it is possible to provide the first active layer with an energy gap greater than the energy gap of the second active layer. By also growing the second active layer above the first, the light emitted from the second active layer will not be absorbed by the first. Using this principle together with diffusion on selected contact openings on the surface of the final epitaxial wafer, an interleaved wavelength LED array is fabricated.

DETAILED DESCRIPTION OF THE PREFERRED EMBODIMENT

Figure 1:
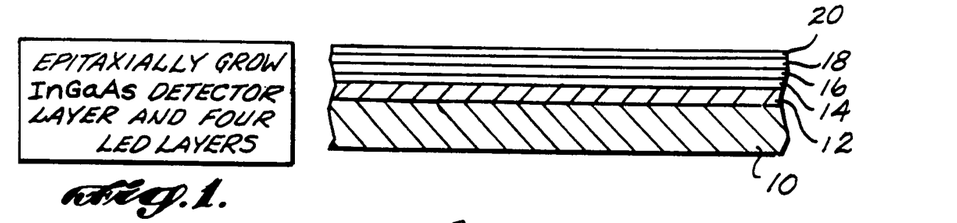
FIGS. 1-5 are diagrammatic, cross-sectional views of an interleaved LED/PIN array being fabricated in accordance with the invention, together with a flow chart describing steps within the fabrication process.

Referring to FIGS. 1-5, an array of interleaved LEDs and PIN photodiodes emitting and detecting light at 1.3 μm wavelength is fabricated with InP-based materials. The process begins with a heavily doped n-type InP substrate or wafer 10 having a thickness of about 100 μm. As illustrated in FIG. 1, an InGaAs detector layer 12 is epitaxially grown on the InP substrate to a thickness of about 4 μm. The doping of this active detector layer, the so-called "intrinsic" or "i" layer, is kept relatively low, to a range of about mid-$10^{15} cm^{-3}$.

The preferred alloy for the active detector layer 12 is $In_{0.53}Ga_{0.47}As$. This photoconductor is selected for three reasons. First, the alloy has a bandgap that is responsive to 1.3 μm photons. Second, this material has electron mobility that is higher than other alloys of the same family, e.g. InGaAsP. Higher mobility gives rise to shorter transit time of the photogenerated electrons in the depletion region of the detector, thus providing the detector with a higher response speed. Third, $In_{0.53}Ga_{0.47}As$ has good lattice match to the InP substrate so that the active layer in the PIN detector has fewer defects. As a consequence, the resulting PIN detectors have long life and reliability.

The 4 μm thickness for the active layer is determined from the reciprocal of the absorption coefficient of the active layer at the operating wavelength, i.e., at 1.3 μm. This active layer thickness insures that all signal photons will be absorbed in the depletion region of the PIN detector. Therefore, the loss of signal photons is minimized and the quantum efficiency of the detector is high.

Referring again to FIG. 1, the four layers for the LED structures are grown on top of the InGaAs intrinsic layer 12. To enhance performance, reliability and uniformity between devices, the InGaAs detector layer and four LED layers are preferably grown in a single run. As shown in FIG. 1, the four epitaxial layers for the LEDs are, in sequence beginning with the layer on top of the InGaAs detector layer 12, an n-type InP buffer layer, or confining layer 14, an InGaAsP active emitter layer 16, a p-type InP confining layer 18, and a p-type InGaAsP cap layer 20. Each of the four LED layers 14, 16, 18 and 20 has a thickness of about 1 μm.

Figure 3:
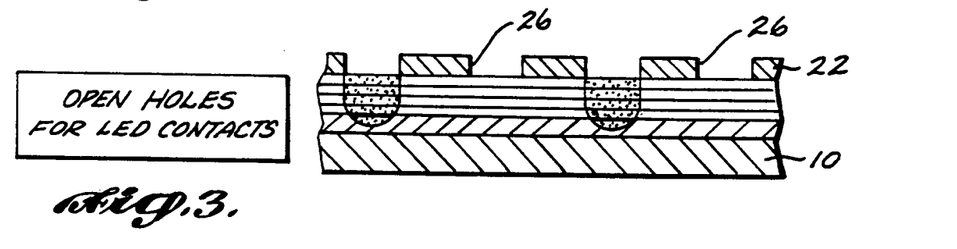
Figure 4:
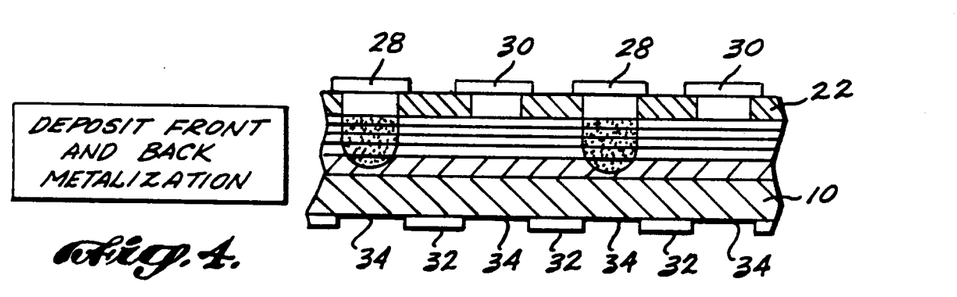
Figure 5:
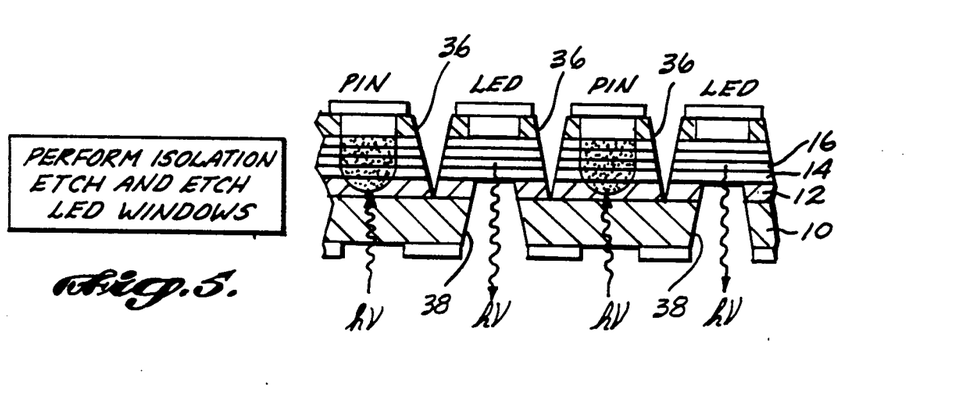

After completion of the epitaxial growth steps, the photodetector array is completed using conventional planar processing techniques in the sequence illustrated in FIGS. 2-5. Referring for a moment to FIG. 5, the process here described produces a generally linear array of LEDs and PIN photodiodes that are arranged in alternating manner next to one another. Advantageously, the array architecture and constituent materials are selected so that the LEDs and PIN photodiodes emit and detect light at the same wavelength, here 1.3 μm, along parallel paths. That is to say, the PIN and LED devices are arranged so that the PIN photodiodes receive light traveling in the opposite direction to the light emitted by the LEDs and along a path that is parallel to the path of the LED emissions.

Figure 2:
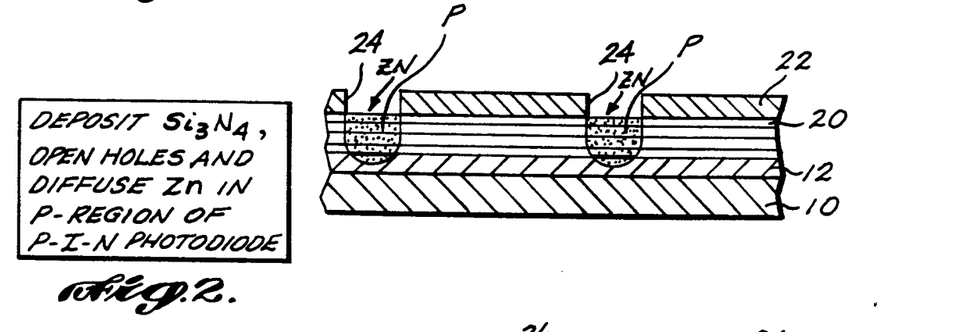

Referring now to FIG. 2, the planar processing begins with the deposition of a silicon nitride layer 22 on the cap layer 20. Thereafter, holes 24 having a diameter of about 90 μm and spaced approximately 1000 to 500 μm apart are formed. Zinc is then diffused deep into the structure to form the p-region for the PIN structure, i.e., zinc is diffused deep enough to go partially into the InGaAs detector layer 12. This p-region is schematically illustrated by the stippled portions of the structure designated "p" in FIG. 2. After the zinc diffusion to form the p-regions for the PIN detectors, holes 26 for the LED contacts are opened through the silicon nitride layer. For the embodiment under description, the holes are about 25 μm in diameter and are spaced approximately 1000-500 μm from one another at positions that lie at the midpoints between the p-regions formed by the zinc diffusion. This arrangement is illustrated in FIG. 3.

Referring now to FIG. 4, metallization is deposited on the "front" and "back" of the wafer. For ease of description, the term "front" is used here to refer to the side of the wafer having the silicon nitride layer 22 and holes 26, while the term "back" is used to refer to the exposed surface of the InP substrate 10 that lies opposite the "front" of the wafer.

Using conventional photolithographic processing, the front metallization is patterned to form individual p-contacts 28 for the PIN photodiodes and individual p-contacts 30 for the LEDs. The back metallization is also appropriately patterned to form n-contacts 32 for each of the devices. As shown in FIG. 4, the patterning of the back metallization and the arrangement of the n-contacts 32 is such as to leave an opening 34 for each device in the array.

In the next step, as illustrated in FIG. 5, an isolation etch is performed between each of the devices from the front of the wafer. The purpose of this isolation etch is to electrically and optically isolate each device in this array. For this purpose, the etching is performed sufficiently deep into the wafer to remove a portion of each of the epitaxial layers from between each device in the array; i.e., etching is performed through the silicon nitride layer 22, the four LED layers 14, 16, 18 and 20, and the detector layer 12 to the "upper" surface of the substrate 10. As illustrated in FIG. 5, this process forms v-shaped grooves 36 between the active components of the array.

Following the isolation etch, a window 38 is formed on the back of the InP substrate 10 for each LED in the array. This is accomplished by etching a hole through the InP substrate 10 and InGaAs detector layer 12 up to the first LED layer, i.e., up to the n-type InP buffer layer 14. It will be readily appreciated that a selective etchant is used in this window-forming procedure to remove the desired portions of the InGaAs intrinsic layer 12.

An alternative sequence for fabricating an interleaved LED/PIN photodetector array is illustrated in FIGS. 6-11. This procedure utilizes a GaAs-based system of materials to form an interleaved LED/PIN array operating at a 0.8 μm wavelength. This method starts with a heavily doped n-type GaAs substrate, or wafer, 40 instead of the InP substrate used in the process discussed with reference to FIGS. 1-5. The substrate 40 is heavily doped n-type GaAs and has a thickness of about 100 μm. Onto this substrate there is epitaxially grown a GaAlAs "stop etch" window layer 42. This layer is approximately 1 μm thick and is formed of GaAlAs alloy having approximately 30% aluminum. Following the growth of this "stop etch" window layer, all of the layers for the active devices are epitaxially grown. As with the first embodiment of the invention, it is preferred to grow all of these layers as well as the initial "stop etch" window layer 42 in a single run.

Figure 6:
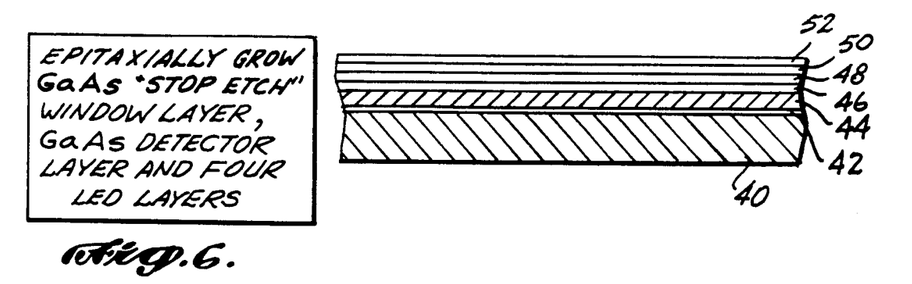
FIGS. 6-11 are diagrammatic, cross-sectional views of an interleaved LED/PIN array being fabricated in accordance with an alternative embodiment of the invention, together with a flow chart describing steps within the fabrication process.
Figure 7:
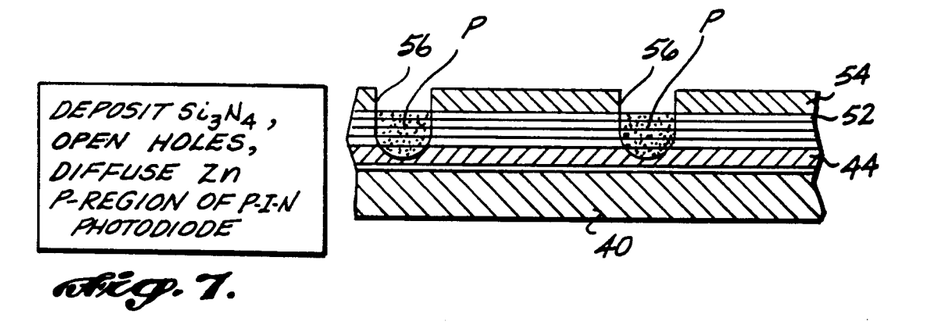
Figure 8:
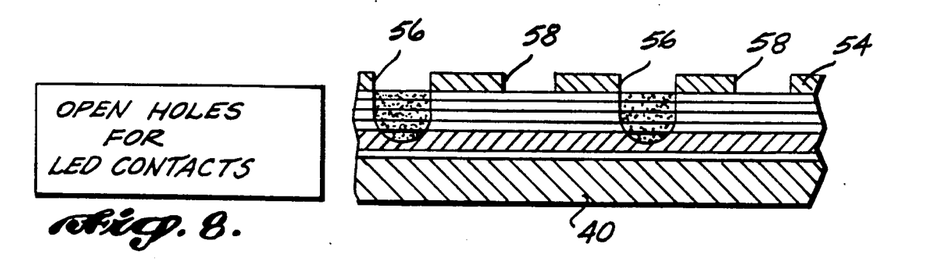

The first formed active layer is an approximately 4 μm GaAs detector layer or intrinsic or "i" layer 44, which has doping in the mid-$10^{15}$cm$^{-3}$ range. On top of the detector layer 44, four layers for the LEDs are grown. These four layers are, in sequence beginning with the first grown layer, an n-type GaAlAs (approximately 25% Al) buffer layer 46, a GaAlAs (approximately 0.05% Al) active emitter layer 48, a p-type GaAlAs (approximately 25% Al) confining layer 50, and a p-type GaAs cap layer 52. Each of the layers is about 1 μm thick so that the overall thickness of the LED layers is about 4 μm. The arrangement of these layers is shown in FIG. 6.

Following this epitaxial growth sequence, zinc diffusion to form the p-region for the PIN photodiodes is carried out using the same techniques used for the zinc diffusion in the procedure described in conjunction with FIGS. 1-5. This involves depositing a layer 54 of silicon nitride on top of the cap layer 52, opening holes 56 through the nitride layer, followed by diffusion of zinc partially into the GaAs intrinsic layer 44 to form the p-regions shown as the shaded areas designated "p" in FIG. 7. With a 1 μm thickness for each of the LED layers and a 4 μm thickness for the detector layer 44, the zinc is diffused approximately 5 to 6 μm into the wafer.

After the zinc diffusion, holes 58 approximately 25 μm in diameter and spaced approximately 1000 to 500 μm apart at points equidistantly between the holes 56 and just-formed p-regions are opened through the nitride layer 54 to begin the formation of the p-contacts for the LEDs. This procedure produces the structure shown in FIG. 8.

Figure 9:
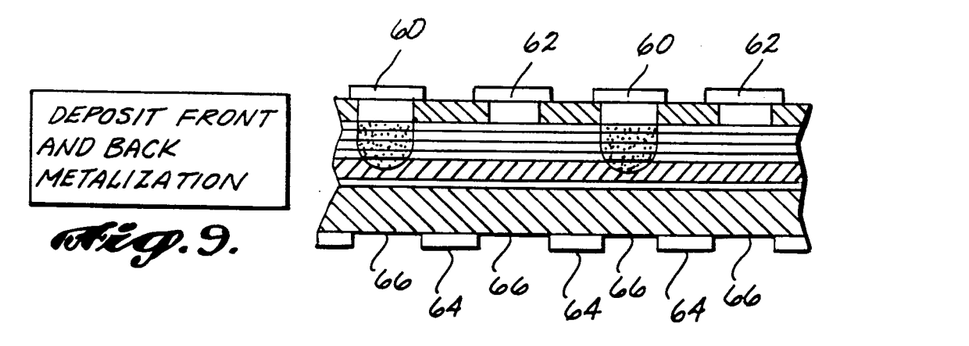

In the next step, a procedure similar to that used in the first embodiment is used to deposit and appropriately pattern metallization on the "front" and "back" of the wafer. The terms "front" and "back" are again arbitrarily used for reference to identify the silicon nitride side and exposed GaAs substrate side, respectively, of the wafer. This metallization procedure produces the p-contacts 60 for each of the PIN diodes, p-contacts 62 for each of the LEDs, and n-contacts 64 for each of the devices on the "back" of the wafer. The n-contacts 64 are arranged to leave an opening 66 in the back metallization for each device in the array.

Figure 10:
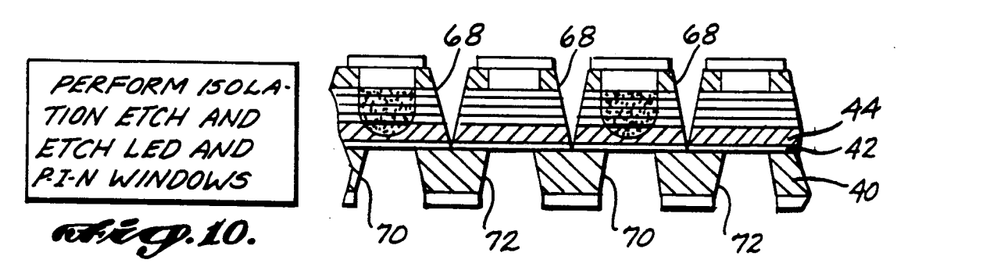

As illustrated in FIG. 10, following the front and back metallization, an isolation etch is performed on the front of the wafer to provide v-shaped grooves 68 that electrically and optically isolate each device in the array. To achieve this purpose, the isolation etching is performed sufficiently deep into the wafer to remove portions of each of the epitaxial layers between each of the devices.

Following the isolation etch, further etching is performed on the "back" of the wafer to open windows 72 for each LED in the array and windows 70 for each PIN photodiode in the array. This window-opening etch is to be contrasted with the window-opening etch procedure of the first embodiment, as illustrated in FIG. 5, where windows 38 are opened only for the LEDs and not for the PIN devices. In the procedure of the second embodiment now under discussion, a selective etchant is used so that the etching stops as the GaAlAs "stop etch" window layer 42 (see FIG. 10). The portion of this layer underlying the PIN photodiodes is not further etched. However, since this layer is formed from GaAlAs, it has a larger energy gap than the GaAs active detector layer 44. Thus, 0.8 μm wavelength photons can penetrate through the window formed by this layer and be absorbed in the GaAs "i" layer 44.

Figure 11:
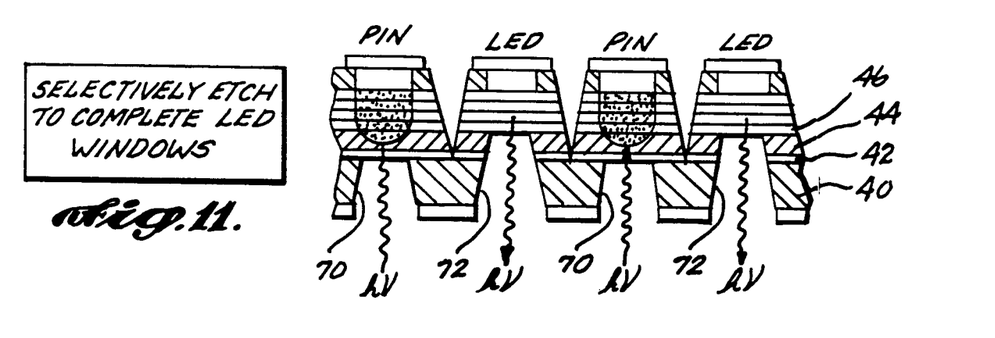

As shown in FIG. 11, after forming windows on the "back" of the substrate for the PIN devices, further selective etching is performed to extend the LED windows 72 deeper into the substrate; that is, the etching is performed through the GaAlAs "stop etch" window layer 42, the GaAs detector layer 44, and into the first LED layer, i.e., the n-type GaAlAs buffer layer 46. At the conclusion of this step, the LED/PIN array has the completed form shown in FIG. 11.

Figure 12:
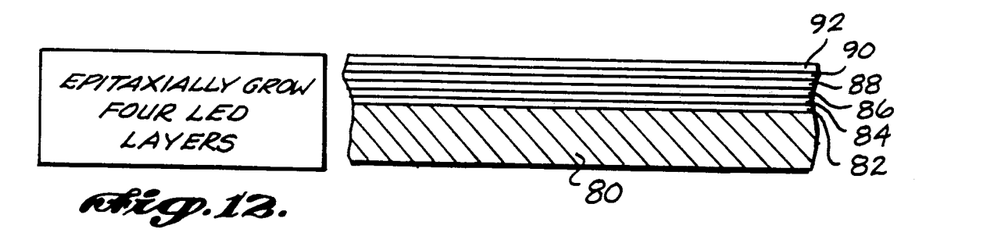
FIGS. 12-17 are diagrammatic, cross-sectional views of an interleaved array of different wavelength LEDs being fabricated in accordance with a second alternative embodiment of the invention, together with a flow chart describing steps within this alternative fabrication process.

According to an additional embodiment of the invention, an interleaved array of LEDs operating at two different wavelengths is fabricated using the sequence illustrated in FIGS. 12–17. This procedure utilizes an InP-based system of materials to form an interleaved array of LEDs operating at a first LED wavelength $\lambda_1$, e.g. 1.1 µm and a second LED wavelength $\lambda_2$, e.g. 1.3 µm. This process begins with a heavily doped n-type InP substrate or wafer 80 having a (100) orientation. As illustrated in FIG. 12, six layers are grown on top of the InP substrate 80 in a single epitaxial growth run. The first layer grown on the InP substrate is an n-type InP buffer layer 82 having a thickness of about 2 µm. The next growth layer 84 is the first quarternary, or active, layer for the first set of LEDs that produce the $\lambda_1$ wavelength emission. This layer is about 1 µm thick and an n-type material having a composition $In_xGa_{1-x}As_yP_{1-y}$. The third layer is an n-type InP confining layer 86 that has grown to a thickness of about 0.5 µ. The fourth layer is the second quarternary, or active, layer 88 for the LEDs operating at the second wavelength $\lambda_2$. This layer is grown to a thickness of about 1 µ and has the composition $In_aGa_{1-a}As_bP_{1-b}$.

The fifth layer is a p-type InP confining layer 90 for the second active layer 88 and has a thickness of about 0.5 µm. The sixth or final layer is a cap layer 92 with composition $In_cGa_{1-c}As_dP_{1-d}$ and a thickness of about 0.5 µm. The function of this layer is to provide a good ohmic contact for the LED arrays.

Figure 13:
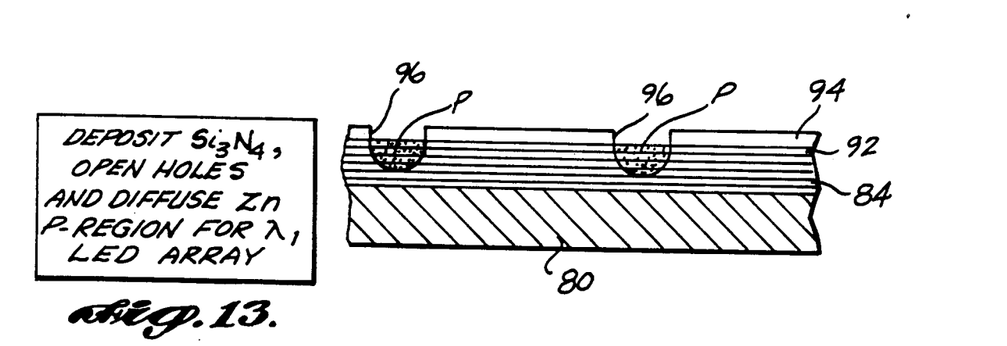
Figure 14:
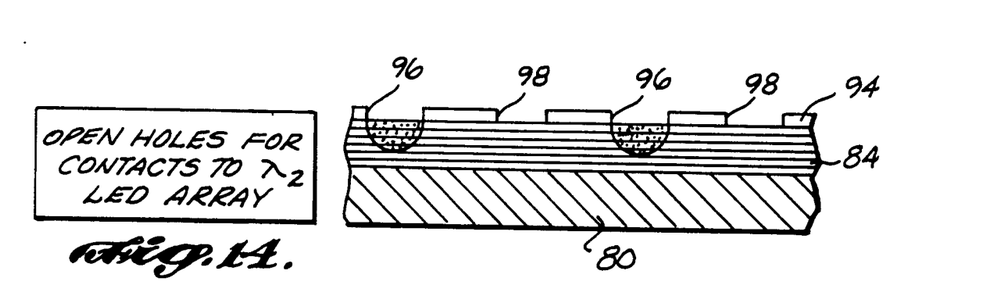

After completion of the epitaxial growth steps, the array is completed using conventional planar processing techniques. This planar processing begins with the deposition of a silicon nitride layer 94 on top of the cap layer 92. Thereafter, as illustrated in FIG. 13, a first set of holes 96 having a diameter of about 25 µm and spaced approximately 500 µm apart are opened through the silicon nitride layer. These holes are for the $\lambda_1$ LED arrays. Zinc is then diffused down to the first active layer 84 to form the p-region designated "p" in FIG. 13, for each of the $\lambda_1$ wavelength LEDs in the first array. Following zinc diffusion, a second set of holes 98 is formed through the nitride layer 94 at positions that lie at the midpoints between the holes 96 and p-regions formed by the zinc diffusion. These second holes 98 are for the contacts to the LEDs in the $\lambda_2$ wavelength array. The structure at this juncture in the fabrication sequence is as shown in FIG. 14.

Figure 15:
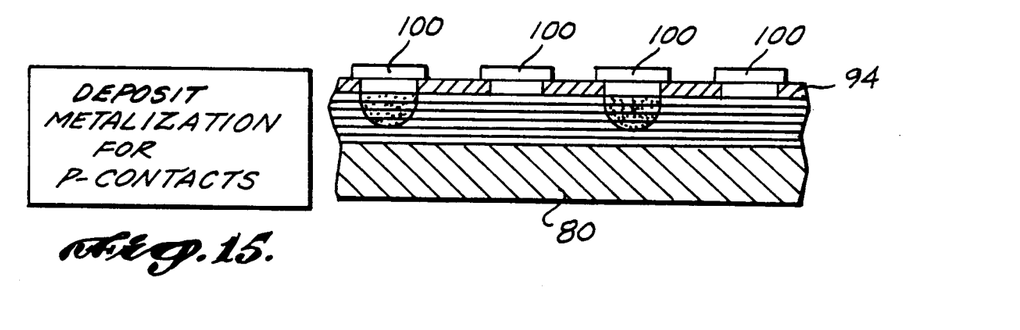
Figure 16:
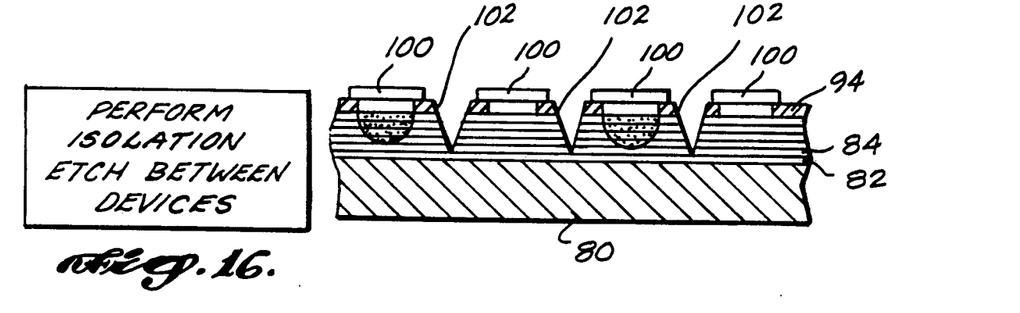
Figure 17:
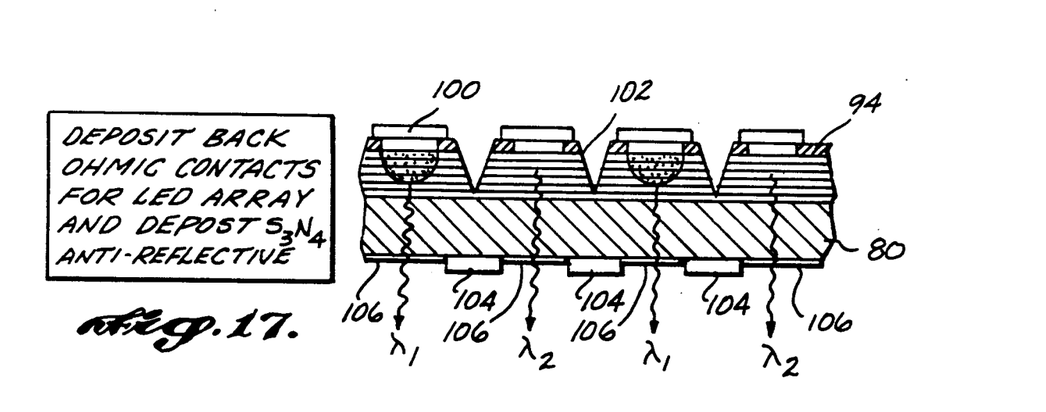

After all openings have been formed on the top of the nitride layer, metallization is deposited on the "front" of the wafer. The term "front" is used here to refer to the side of the wafer having the silicon nitride layer 94, while the term "back" is used to refer to the exposed surface of the InP substrate 80 that lies opposite the "front" of the wafer. Using conventional photolithographic processing, the front metallization is patterned to form individual p-contacts 100 to each device in the array. Following formation of the p-contacts, an isolation etch is performed between each of the devices to provide electrical and optical isolation. To this end, the etching is performed deep into the epitaxial layers through and including the first active layer 84 down to the InP buffer layer 82. As shown in FIG. 16, this process forms v-shaped grooves 102 between each component in the array.

Following the isolation etch, ohmic contacts 104 for the LEDs are formed on the back of the substrate 80 by depositing and suitably patterning a metallic material. To maximize the LED light output, an anti-reflective coating 106 for each of the LEDs is formed by depositing silicon nitride in the openings that were left as a result of the formation of the ohmic contacts. At the conclusion of this step, the completed array has the structure illustrated in FIG. 17.

While the invention has been described with reference to a preferred embodiment, it will be understood by those skilled in the art that various changes can be made therein without departing from the spirit and scope of the invention.

The embodiments of the invention in which an exclusive property or privilege is claimed are defined as follows:

1. An integrated optical device, comprising:
   a substrate having opposed front and back surfaces;
   a linear array of light emitting diodes and photodiodes integrally formed from a plurality of layers grown upon the first surface of such substrate, said light emitting diodes and photodiodes being spaced apart and interspersed in alternating manner so that no photodiode is next to another photodiode and no light emitting diode is next to another light emitting diode, said light emitting diodes having separate, parallel light output paths for emitting light in a direction outward from the back surface of said substrate, said photodiodes having separate light input paths for light incident on the back surface of said substrate, said light input paths being parallel to one another and to the light output paths of said light emitting diodes, said light emitting diodes and said photodiodes being operable at the same wavelength, each of said light emitting diodes having an active region formed in one of said plurality of layers, each of said photodiodes having an active region formed in a different, non-adjacent one of said plurality of layers, the active regions of said photodiodes being closer to said substrate than the active regions of said light emitting diodes; and
   metal contacts disposed on one of said plurality of layers and on the back surface of said substrate for applying current to drive said light emitting diodes in the linear array of light emitting diodes, the metal contacts on the back surface being arranged to define openings therebetween, one of said openings being provided for each of the light input paths of said photodiodes and one of said openings being provided for each of the light output paths of said light emitting diodes.

2. The device of claim 1, wherein the substrate, the active regions of said light emitting diodes, and the active regions of said photodiodes are each formed of a Group IIIA-VA compound.

3. The device of claim 2, wherein the substrate is made of InP, the active regions of said light emitting diodes are made of InGaAsP, and the active regions of said photodiodes are made of InGaAs.

4. The device of claim 2, wherein the substrate is made of GaAs, the active regions of said light emitting diodes are made of GaAlAs, and the active regions of said photodiodes are made of GaAs.

5. The device of claim 1, wherein the device is operable at data rates of at least 200 Mbits per second, and wherein said photodiodes have a dark current ($I_d$) less than about 10 nA, quantum efficiency (QE) greater than about 75%, and a capacitance less than about 1pF.

6. The optical device of claim 1, wherein said plurality of layers comprises:
   an intrinsic semiconductor layer on the front surface of the substrate;
   a first n-type confining layer on said intrinsic semiconductor layer;
   an active light emitting layer on said confining layer;
   a second p-type confining layer on said light emitting layer; and
   a p-type cap layer on said second confining layer;
   each of said confining layers having a band gap that is larger than the band gap of said light emitting layer.

7. The device of claim 6, wherein said substrate, said intrinsic semiconductor layer, and said active light emitting layer are each formed of a Group IIIA-VA compound.

8. The device of claim 7, wherein the Group IIIA-VA compounds are selected so that said linear array of light emitting diodes and photodiodes respectively emit and absorb photons having a substantially same wavelength.

9. The device of claim 8, wherein said wavelength is 1.3 micrometers, and further including:
   an LED window formed through said substrate and said intrinsic semiconductor layer to said first confining layer of each of said linear array of light emitting diodes.

10. The device of claim 9, further including a groove formed between each of said linear array of light emitting diodes and photodiodes to electrically and optically isolate the light emitting diodes from the photodiodes, said groove extending through said cap layer, said confining layers, and said intrinsic semiconductor layer.

11. The device of claim 8, wherein said wavelength is 0.8 micrometers, and further including:
   a window layer interposed between said substrate and said intrinsic semiconductor layer, said window layer being substantially transparent to said wavelength;
   a first window formed through said substrate to said window layer for each PIN photodiode in the array; and
   a second window formed through said substrate, said window layer, and said intrinsic semiconductor layer to said first confining layer for each light emitting diode in the linear array of light emitting diodes.

12. The device of claim 11, wherein said second windows and said first windows are formed between said metal contacts.

13. The device of claim 12, further including a groove formed between each of the light emitting diodes and photodiodes in the array to electrically and optically isolate the light emitting diodes from the photodiodes, said groove extending through said cap layer, said confining layers, said intrinsic semiconductor layer, and said window layer.

14. An integrated optical device comprising:
   an n-type substrate having opposed front and back surfaces and a thickness of about 100 $\mu$m to about 150 $\mu$m;
   an intrinsic semiconductor layer on the front surface of said substrate, said intrinsic semiconductor layer having a thickness of about 4 $\mu$m to about 6 $\mu$m;
   a first n-type confining layer on said intrinsic semiconductor layer, said first n-type confining layer having a thickness of about 1 $\mu$m;
   an active light emitting layer on said first n-type confining layer, said active light emitting layer having a thickness of about 0.5 $\mu$m;
   a second p-type confining layer on said light emitting layer, said second p-type confining layer having a thickness of about 1 $\mu$m;
   a p-type cap layer on said second n-type confining layer, said p-type cap layer having a thickness of about 0.5 $\mu$m to about 1 $\mu$m;
   each of said confining layers having a bandgap that is larger than the bandgap of said active light emitting layer;
   portions of said intrinsic semiconductor layer being doped with a p-type material to form a plurality of active light detecting regions, said portions being physically separated from one another so that said light detecting regions are spaced apart from one another to form, in conjunction with said substrate, a plurality of PIN photodiodes, said plurality of PIN photodiodes having separate, parallel light input paths for light incident on the back surface of said substrate;
   portions of said cap layer, said first and second confining layers, and said active light emitting layer forming a plurality of surface emitting LEDs, said portions being physically separated from one another and interspersed with the doped portions of said intrinsic semiconductor layer so that said plurality of surface emitting LEDs are spaced apart from one another and interspersed with the light detecting regions to form an interleaved array of alternating PIN photodiodes and LEDs, said plurality of LEDs having separate light output paths that are parallel to on another and to the light input paths of said plurality of PIN photodiodes,
   said PIN photodiodes and LEDs being operable at the same wavelengths; and
   means connected to said cap layer and to the back surface of said substrate for passing current through the active light emitting layers of said LEDs and
   through the active light detecting regions of said intrinsic semiconductor layer.

15. The device of claim 14, wherein said wavelength is 1.3 micrometers and said n-type substrate is made of InP, said intrinsic semiconductor layer is made of In$_{0.53}$Ga$_{0.47}$As, said first n-type and second p-type confining layers are made of InP, said active light emitting layer is made of InGaAsP, and said p-type cap layer is made of InGaAsP.

16. The device of claim 14, wherein said wavelength is 0.8 micrometers and said n-type substrate is made of GaAs, said intrinsic semiconductor layer is made of GaAs, said first n-type and second p-type confining layers are made of Ga$_{0.75}$Al$_{0.25}$As, said active light emitting layer is made of Ga$_{0.95}$Al$_{0.05}$As, and said p-type layer is made of GaAs.

* * * * *

UNITED STATES PATENT AND TRADEMARK OFFICE
CERTIFICATE OF CORRECTION

PATENT NO. : 5,055,894
DATED : October 8, 1991
INVENTOR(S) : Eric Y. Chan

It is certified that error appears in the above-identified patent and that said Letters Patent is hereby corrected as shown below:

| COLUMN | LINE | |
|---|---|---|
| 1 | 22 | "high-level" should be --high-yield-- |
| 1 | 55 | "application." should be --applications.-- |
| 1 | 66 | "(at 31 10 volts)" should be --(at -10 volts)-- |
| 1 | 67 & 68 | "(at 31 10 volts)" should be --(at -10 volts)-- |
| 3 | 31 | "in$_x$" should be --In$_x$-- |
| 6 | 55 | "as" should be --at-- |
| 7 | 17 | "growth" should be --grown-- |
| 8 | 46 | after "said" delete "light emitting diodes in the linear array of light emitting diodes" and insert therefor --linear array of light emitting diodes and photodiodes-- |
| 9 | 4 | "comprises" should be --comprise-- |
| 9 | 29 | after "layer of" delete "each of" |
| 10 | 40 | "on" should be --one-- |
| 10 | 43 | "wavelengths" should be --wavelength-- |
| 10 | 52 & 53 | "In$_{0.5-3}$Ga$_{0.47}$AS" should be --In$_{0.53}$Ga$_{0.47}$AS-- |

UNITED STATES PATENT AND TRADEMARK OFFICE
CERTIFICATE OF CORRECTION

PATENT NO. : 5,055,894

DATED : October 8, 1991

INVENTOR(S) : Eric Y. Chan

It is certified that error appears in the above-identified patent and that said Letters Patent is hereby corrected as shown below:

| COLUMN | LINE | |
|---|---|---|
| 10 | 62 | after "p-type" insert --cap-- |

Signed and Sealed this

Sixteenth Day of March, 1993

Attest:

STEPHEN G. KUNIN

Attesting Officer     Acting Commissioner of Patents and Trademarks